United States Patent [19]

Cenker et al.

[11] 4,241,425
[45] Dec. 23, 1980

[54] ORGANIZATION FOR DYNAMIC RANDOM ACCESS MEMORY

[75] Inventors: Ronald P. Cenker, Coplay; Donald G. Clemons, Walnutport; William R. Huber, III; Frank J. Procyk, both of Center Valley, all of Pa.

[73] Assignee: Bell Telephone Laboratories, Incorporated, Murray Hill, N.J.

[21] Appl. No.: 10,839

[22] Filed: Feb. 9, 1979

[51] Int. Cl.³ .............................................. G11C 11/40
[52] U.S. Cl. .................................... 365/222; 361/49; 361/189; 307/238
[58] Field of Search ................ 365/49, 174, 189, 222; 307/238

[56] References Cited

U.S. PATENT DOCUMENTS

| | | | |
|---|---|---|---|
| 3,737,879 | 6/1973 | Greene | 365/222 |
| 3,811,117 | 5/1974 | Anderson | 365/222 |
| 3,846,765 | 11/1974 | DeVries | 365/222 |
| 4,106,108 | 8/1978 | Cislaghi | 365/222 |

*Primary Examiner*—Terrell W. Fears
*Attorney, Agent, or Firm*—Arthur J. Torsiglieri

[57] ABSTRACT

An MOS dynamic random access memory (RAM) includes an array of memory cells arranged in rows and columns. The array is divided into two or more sub-arrays. In an operating cycle where a cell is being accessed for reading and/or writing, only the sub-array containing the accessed cell is fully selected while the other sub-arrays are partially selected. A fully selected sub-array is one in which both a row and a column are selected, whereas in a partially selected sub-array, only a row is selected. In the partially selected sub-array where only refreshing of the cells in the selected row takes place, the column decoders and drivers remain inactive throughout the memory cycle.

5 Claims, 10 Drawing Figures

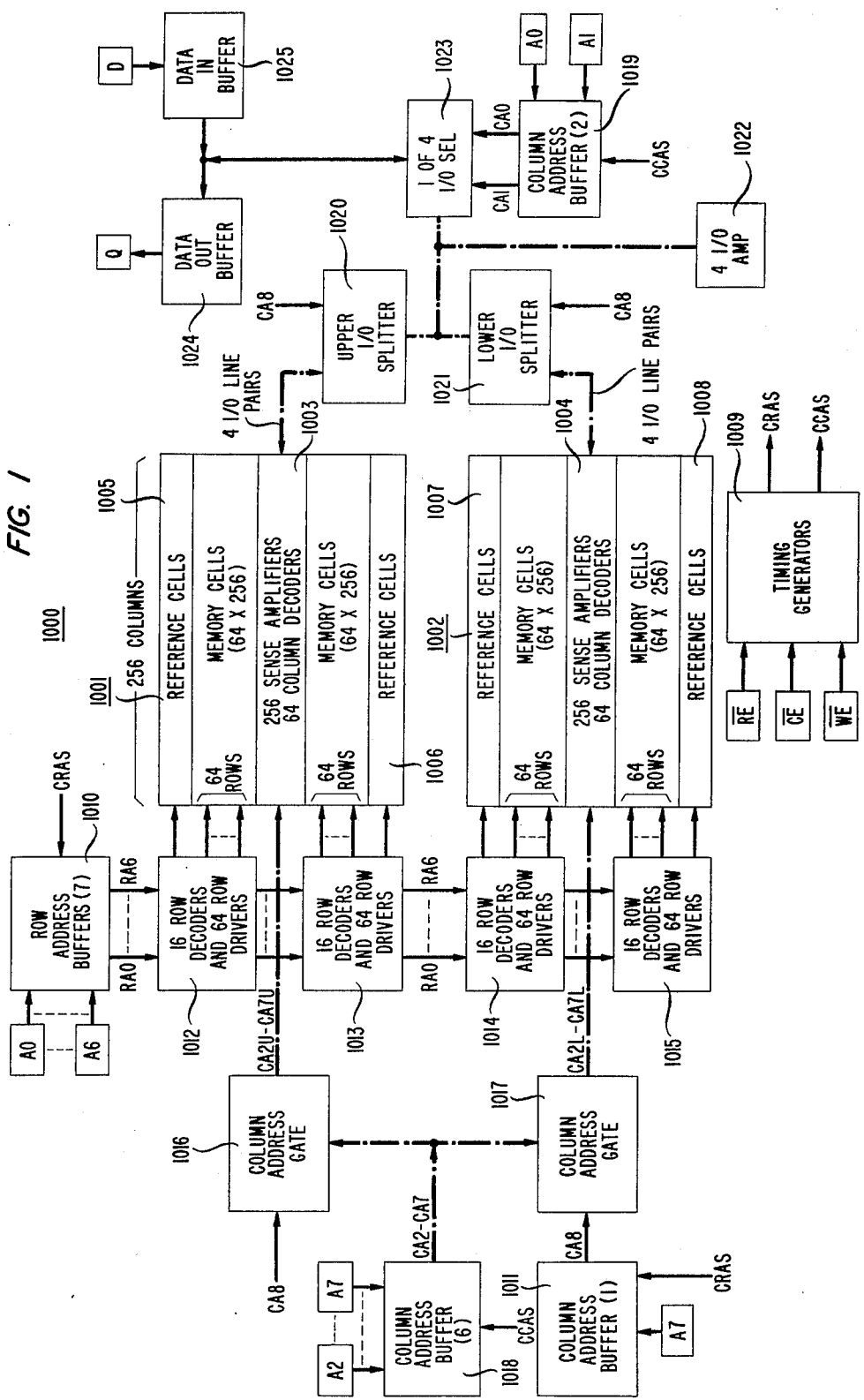

ORGANIZATION FOR DYNAMIC RANDOM ACCESS MEMORY

BACKGROUND OF THE INVENTION

This invention relates to semiconductor memory devices, and more particularly to an organization for a high density dynamic metal-oxide-semiconductor (MOS) random access memory (RAM) having an array of one transistor, one capacitor memory cell.

MOS dynamic RAMs are known in the art. These memories are fabricated on a single silicon chip using known MOS technologies. Typically, n-channel MOS technology is used because of its inherent performance advantages. In recent years there has been a rapid evolution of MOS dynamic RAMs toward increased density and higher performance. Each new generation of RAMs has provided a four-fold increase in storage capacity over those of the previous generation. This evolution has been made possible by advances in n-channel MOS technology and in wafer patterning techniques leading toward a shrinkage in the size of the memory cell. Today MOS RAMs having a storage capacity of 16,384 bits (i.e., 16K RAMs) are commercially available. Presently, manufacturers are starting to introduce a 65,536 bit, or 64K, RAM; see *Electronics,* Sept. 28, 1978, pp. 109 to 116.

One important consideration in the design of a high density dynamic RAM is that of providing adequate signal for sensing. As mentioned above, RAMs of higher density are made possible by reducing the size of the memory cell. However, decreasing the cell size also decreases its storage capacitance. Moreover, as an increased number of cells are included in the array, the number of cells coupled to a bit-line (column conductor) is increased. Therefore, the capacitance of the bit-line is also increased. Inasmuch as the magnitude of the data signal presented to a sense amplifier is proportional to the ratio of the storage capacitance of the cell to the capacitance of the bit-line, it is clear that this ratio must be kept as high as necessary to insure an adequate signal for sensing.

A technique for reducing the bit-line capacitance which is widely used in commercially available 16K RAMs is described in *IEEE Journal of Solid State Circuits,* October 1976, pp. 570–573 by Ahlquist et al. The technique is to divide the array of memory cells into two sub-arrays. For example, in the case of a 16K RAM instead of using a single array of 128 rows and 128 columns, two arrays of 64 rows and 128 columns are used. Accordingly, the number of cells coupled to each bit-line is reduced from 128 to 64, and thus the bit-line capacitance is reduced by a factor of two while the data signal presented to a sense amplifier is increased by the same factor. Therefore, it is known in the art that by dividing a memory array into sub-arrays, the bit-line capacitance may be reduced.

Another important consideration in the design of a new generation high density RAM is that of compatibility with previous generation RAMs. For example, important commercial advantages are gained by designing a 64K RAM to be compatible with industry standard 4K or 16K RAMs to permit users to directly substitute in their memory systems 64K parts for 4K or 16K parts without having to redesign their systems. In general, compatibility is important in the areas of package type and size, assignment of package pin functions, and in the number of refresh cycles required by the RAM.

Refreshing of a dynamic RAM is accomplished by sensing and restoring the voltage levels present on each cell in the memory array. This is normally done one row at a time so that the number of cycles required is equal to the number of rows in the array. Normally, each time a row in the array is selected all cells along the row are automatically refreshed. Therefore, one way to achieve compatibility in the number of refresh cycles is for the new generation RAM to have the same number of rows as a previous generation RAM. For example, the array of the 16K RAM described in the above-identified Ahlquist et al reference has a total of 128 rows in two sub-arrays. Thus if the array is refreshed one sub-array at a time then 128 refresh cycles would be required which is the industry standard refresh sequence for a 16K RAM. However, the sub-arrays in the Ahlquist RAM can also be refreshed in parallel; that is, corresponding rows in each sub-array can be refreshed at the same time. In the case of a 64K RAM a straightforward 256 row by 256 column array would result in a 256 cycle refresh sequence which would make it incompatible with the industry standard 16K RAM.

One possible organization for a 64K RAM for providing a 128 cycle refresh sequence is to have a single array of 128 rows and 512 columns. However, such an organization would result in a memory chip having an awkward aspect ratio, and one which would not fit into the industry standard 16 pin package used by 16K RAMs. A more favorable chip aspect ratio may be obtained for the 64K RAM by using an organization having two sub-arrays of 128 rows and 256 columns in which a row in each sub-array is simultaneously selected in a given operating cycle. An operating cycle is an interval during which a memory function such as reading, writing, refreshing or a combination thereof takes place in the RAM. Since a row in each sub-array is refreshed in each refresh cycle, 128 refresh cycles are sufficient to refresh the entire RAM. Therefore, dividing the memory array into sub-arrays provides the flexibility necessary to achieve compatibility between old and new generation RAMs.

A major consideration in the design of a high density RAM is that of minimizing the power dissipation of the memory chip. Additional circuits and larger loads associated with chips having a larger number of cells result in increased power dissipation. However, the above-mentioned compatibility consideration that the new generation RAM be a direct substitute for older generation RAMs in existing memory systems which were designed according to the power specifications of older generation RAMs imposes a critical restriction on the power dissipation of the new generation RAM. Therefore, a major problem in high density RAM design is that of limiting power dissipation.

An arrangement for reducing power dissipation in a 16K RAM organized in two sub-arrays described in the above-cited Ahlquist et al. paper is to activate only one sub-array in a given operating cycle and to keep the other sub-array totally inactive. Thus, power dissipation is reduced below that of an arrangement where both sub-arrays are active. However, the arrangement described in Ahlquist is restricted to a memory organization where memory function takes place in only one sub-array in any given operating cycle, and would not be applicable to the organization described above for a 64K RAM where a row in each sub-array is refreshed in any given operating cycle.

SUMMARY OF THE INVENTION

The present invention is an improvement of the RAM organization described in the above-cited Ahlquist et al. paper in which an array of memory cells is divided into sub-arrays, and in which during a given operating cycle a cell is selected in only one sub-array. The improvements include the provision of appropriate means for selecting at a given time for reading and/or writing a single cell in only one sub-array but for refreshing all cells in a corresponding row of each other sub-array.

These improvements provide a RAM organization in which only one sub-array is fully selected (both a row and a column are selected) for reading and/or writing a memory cell while the other sub-arrays are only partially selected (only a row is selected) for refreshing the corresponding row of cells in each of the other sub-arrays. Power dissipation of the improved RAM is reduced owing to the column decoders and column buffers of the partially selected sub-array being inactive.

Accordingly, it is an object of the present invention to provide an organization for a high density dynamic RAM which reduces power dissipation.

It is another object of the present invention to provide an organization for a high density dynamic RAM which permits improved compatibility with previous generation dynamic RAMs.

It is still another object of the present invention to provide an organization for a high density dynamic RAM which permits improved signals for sensing.

The above and other objects of the invention are achieved in an illustrative embodiment described hereinafter. The novel features of the invention, both as to structure and method of operation, together with the other objects and advantages thereof will be better understood from the following description considered in connection with the accompanying drawings. It is to be expressly understood, however, that the drawings are solely for the purpose of illustration and description and are not intended to define limits of the invention.

BRIEF DESCRIPTION OF THE DRAWING

FIG. 1 is a functional block diagram of dynamic RAM according to the instant invention.

DETAILED DESCRIPTION

Figure 4:
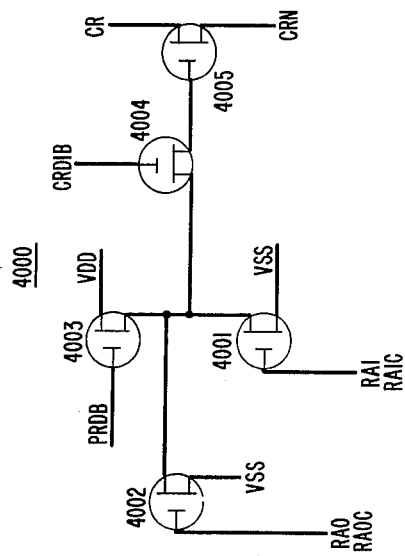
FIG. 4 is a schematic diagram of a row clock decoder circuit.

Referring now to FIG. 1, there is shown a block diagram representative of a dynamic RAM 1000 in accordance with the instant invention. In its preferred embodiment the RAM is fabricated on a single silicon chip using n-channel MOS technology. The chip has 16 terminals or external connections; these include 8 multiplexed address input terminals A0 through A7, external voltage terminals (not shown in FIG. 1) VDD, VSS, and VBB, a data output terminal Q, a data input terminal D, a row enable clock input terminal $\overline{RE}$, a column enable clock input terminal $\overline{CE}$, and a write enable input terminal $\overline{WE}$. For normal operation the external voltages applied to the chip are VDD=8 volts, VSS=ground potential, VBB=−5 volts.

The chip includes a memory cell array which is divided into two sub-arrays, an upper 1001, and a lower 1002. Each sub-array is bisected by a group of 256 sense amplifiers and 64 column decoders into two blocks each having 64 rows and 256 columns of cells to provide 32,768 (32K) cells for each sub-array. The entire array has 65,536 (64K) cells. A row of 256 reference cells is also included in each block. The bisection of each sub-array being across the bit-lines, two half-bit-lines (half-column conductors) are created from each bit-line in the sub-array.

Information contained in a particular cell can be read by first applying a TTL "high" logic level to the $\overline{WE}$ input to select the read mode. An 8-bit address is applied to the inputs A0 through A7. Then a row enable signal going from a TTL "high" logic level to a TTL "low" logic level is applied to the $\overline{RE}$ input to initiate the row clocks included in the timing generators 1009 and to strobe the 7 row address buffers 1010 and the CA8 column address buffer 1011. The TTL level input address signals are converted to MOS level row address signals RA0 through RA6 and column address signal CA8. The MOS address signals are all double-railed; that is, both the address bits and their complements are used for row and column selection. Therefore, each address signal includes both the address bit and its complement. The seven pairs of row address signals are used by the row decoder to select one row out of 128 in each sub-array. The row decoder which also selects a reference cell row in each sub-array consists of four sections 1012 through 1015, one associated with each block. Selection of a row in one block of a sub-array also results in the selection of the reference cell row in the other block of the sub-array. The CA8 address signal is used for various steering and enabling functions to determine which sub-array is to be fully selected. A fully selected sub-array is one in which both a row and a column are selected, whereas a partially selected sub-array is one in which only a row is selected. The CA8 signal is used to gate column address signals to only the column decoders associated with the fully selected sub-array via the column address gates 1016 and 1017.

The selected rows are activated by a "high" logic level signal applied to the row conductors (word lines) associated with the selected rows, and data is transferred from the memory cells and the reference cells via their associated half-column conductors to the sense amplifiers. A "high" logic level in the chip is a voltage which is approximately equal to or greater than VDD−VT where VT is the threshold voltage of the transistors. The small differential voltage signal present between each pair of half-column conductors is amplified to full logic levels upon latching of the sense amplifier. The presence of full logic level signals on the half-column conductors after the sense amplifiers are latched serves to restore full voltage levels to the memory cells of the selected rows. In this manner all the memory cells along the selected rows are automatically refreshed.

After the row enable signal is pulsed to the "low" logic level and the row address buffers are strobed, new address signals can be applied to inputs A0 through A7. A "low" logic level in the chip is a voltage approximately equal to VSS. Next a column enable pulse going from a TTL "high" logic level to a TTL "low" logic level is applied to the $\overline{CE}$ input to initiate the column clocks included in the timing generators and to strobe the 8 column address buffers 1018 and 1019. Once again the TTL level input address signals are converted to double-rail MOS level column address signals CA0 through CA7. After latching of the sense amplifiers the column address signals CA2 through CA7 are transmitted by one of the column address gates, under the control of CA8, to the column decoders of the fully selected sub-array. The other column address gate blocks the column address signals from being transferred to the column decoders of the partially selected sub-array. Thus, only the column decoders of the fully selected sub-array are activated in a given operating cycle while the column decoders of the partially selected sub-array remain inactive to reduce power dissipation.

In the preferred embodiment each column decoder selects 4 out of 256 columns. When column decoding is complete, double-rail signals from the four sense amplifiers associated with the four selected columns are transferred to four input/output (I/O) line pairs associated with the fully selected sub-array. The I/O line pairs of the selected sub-array are coupled via one of the I/O splitters 1020 and 1021 (under the control of CA8) to four I/O amplifiers 1022. The I/O line pairs of the partially selected sub-array are decoupled by the I/O splitters to reduce capacitive loading on the I/O amplifiers. After the double-rail signals from the four selected columns have been amplified by the I/O amplifiers, one pair is selected by the I/O selector 1023 which decodes column address signals CA0 and CA1. The signal on the selected line pair is then transferred to the data out buffer/driver 1024 where a single rail TTL compatible output is generated.

For information to be written into a particular cell (write operation) row selection first takes place in the same manner as described above for a read operation. Prior to applying the column enable signal, the write mode is selected by applying a TTL "low" logic level to the $\overline{WE}$ input terminal. Data to be written into a selected cell is applied to the data input terminal. With the write mode selected the column enable pulse initiates the write clocks included in the timing generators, inhibits the output buffer 1024 from receiving any more information from the memory cell array, and strobes the data in buffer 1025 where the TTL level data signal is converted into a double-rail MOS level signal. Then column selection takes place in the same manner as described above for the read operation. After the I/O splitters have coupled the four I/O line pairs from the fully selected sub-array to the I/O amplifiers, the I/O selector couples the input data signal to a selected I/O line pair (selected by decoding CA0 and CA1). The drive of the data in buffer is sufficient to overwrite the I/O amplifier coupled to the selected I/O line pair. The data signal is routed through the selected I/O splitter to the selected column. The double-rail data signal which originated from the data in buffer overwrites the sense amplifier and is applied to the selected cell as new data to be stored.

In operating cycles where only the refresh function takes place, both the upper and the lower sub-arrays are partially selected. In this mode, only the $\overline{RE}$ input terminal is activated and the $\overline{CE}$ input terminal is maintained at a TTL "high" logic level. This operation causes row selection and sense amplifier latching to occur as in the read operation and terminates with the recovery of the $\overline{RE}$ input to the TTL "high" logic level. In the refresh cycle which is the interval during which $\overline{RE}$ remains at the "low" logic level, 512 cells (256 in each sub-array) are refreshed according to the data previously stored in the cells. Since no column functions are initiated, no data appears at the data out terminal Q, and the power consumption is lower than for a read or write cycle. Row address bits A0 through A6 must be cycled through the 128 combinations to refresh all cells in the array.

Figure 2:
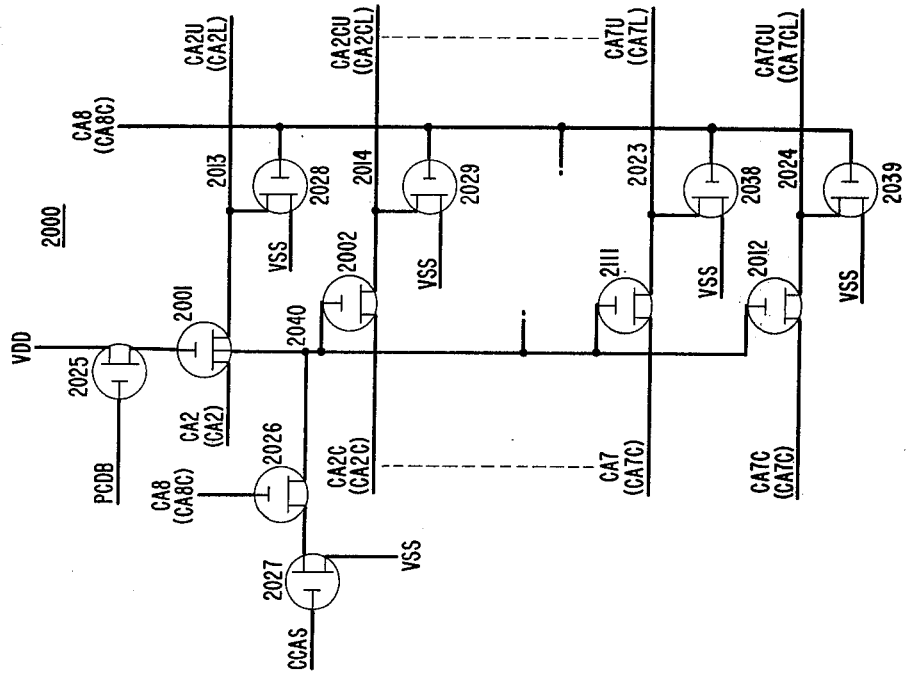
FIG. 2 is a schematic diagram of a column address gate circuit.

Referring now to FIG. 2 there is shown a schematic diagram of the column address gate circuit 2000. Two such circuits are used in the preferred embodiment, one associated with each sub-array. The column address gate steers the column address signals CA2 through CA7 to only the column decoders of the fully selected sub-array. Since the MOS address signals are double-railed, separate inputs are provided for an address bit CAN and for its complement CANC. The circuit includes 12 transmission transistors 2001 through 2012 interposed between the column address signals and the column decoder lines 2013 through 2024 of the associated sub-array. For reasons of simplicity not all the transmission transistors are shown in FIG. 2. The gates of the transmission transistors are coupled to VDD through a percharge transistor 2025. The precharge clock PCDB maintains node 2040 at VDD during the standby period for the circuit and releases node 2040 from its precharge potential prior to the column address strobe clock, CCAS, going "high". Therefore, the transmission transistors are initially in their conducting state. Transistor 2027 is controlled by CCAS which goes "high" when the column address buffers are strobed. Transistors 2026 is controlled by column address bit CA8 in the case of the column address gate associated with the upper sub-array and by the complement of the column address bit CA8C in the case of the column address gate associated with the lower subarray. The column decoder lines may be coupled to VSS by the pull-down transistors 2028 through 2039 which are controlled by the same phase of the column address signal CA8 which controls the transistor 2026. For reasons of simplicity not all the pull-down transistors are shown in FIG. 2. Suppose, for example, CA8 were a "low" logical level corresponding to the upper sub-array being fully selected. Then in the column address gate associated with the upper sub-array transistor 2026 and all the pull-down transistors would be in their non-conducting state. Therefore, when CCAS goes "high", node 2040 would remain at VDD and all the transmission transistors would remain in their conducting state. The column address signals CA2 through CA7 which appear at the inputs of both column address gates shortly after CCAS goes "high" would be transferred to the column decoder lines of the upper sub-array. In the column address gate associated with the lower sub-array transistor 2026 would be in its conducting state by virtue of CA8C being a "high" logic level. When CCAS goes "high" transistor 2027 would become conducting causing node 2040 to go to VSS and the transmission transistors to go to their non-conducting state. Thus the column address signals would be prevented from being transferred to the column decoder lines of the lower sub-array. In addition, the column decoder lines of the lower sub-array would be clamped to VSS by the pull-down transistors which would be in their conducting state by virtue of CA8C being a "high" logic level.

Figure 3:
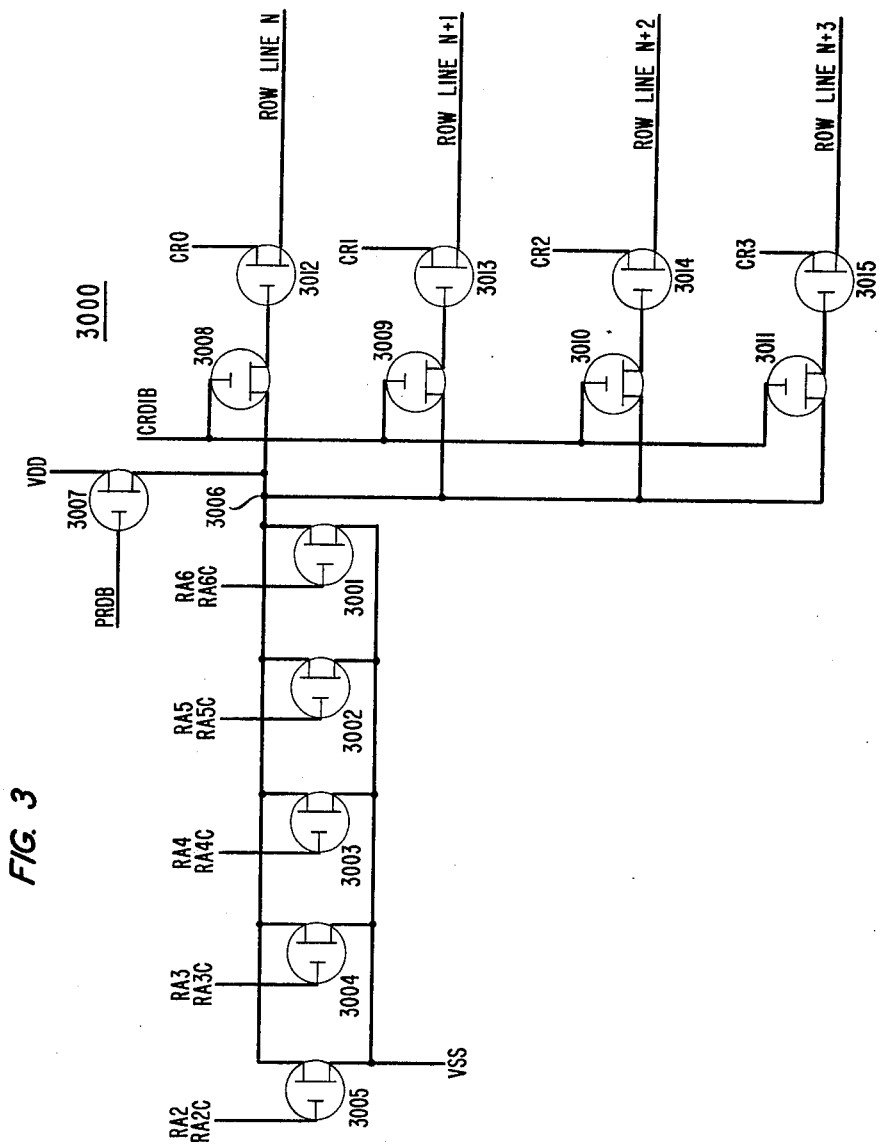
FIG. 3 is a schematic diagram of a row decoder/driver circuit.

Referring now to FIG. 3 there is shown a schematic diagram of the row decoder circuit 3000. The circuit shown serves four row conductors, and is, therefore, replicated 16 times in each block. The five parallel transistors 3001 through 3005 provide a one out of 32 decoding of the row address signals RA2 through RA6. A further one out of four decoding of row address signals RA0 and RA1 is performed by row clock decoders (see FIG. 4) to provide the decoded row clocks CR0 through CR3. Combined, the row decoders and the row clock decoders provide a one out of 128 row selection in each sub-array. Transistor 3007 is for precharging the decode node 3006 to VDD while the circuit is in its standby state. Transistors 3008 through 3011 are for isolating the gates of the driver transistors 3012 through 3015 from the decode node after row decoding is complete. The precharge clock PRDB and the row decoder interrupt clock CRDIB are both boosted above VDD+VT (where VT is the transistor threshold voltage). Therefore, both the decode node and the gates of the driver transistors are precharged to VDD providing extra row line driving capability. Prior to the application of the row address signals RA2 through RA6, PRDB goes from a "high" to a "low" logic level releasing the decode node from its precharged potential. AFter row decoding is complete and the selected row conductor has been driven to VDD, CRDIB goes to a "low" logic level turning off transistors 3008 through 3011. The row address signals then all go to a "low" logic level. Finally, PRDB goes "high" causing the recovery of the decode node back to its precharge potential. The entire recovery sequence for the row address decoder and driver occurs during the active part of the operating cycle, independent of the termination of the row enable signal.

A schematic diagram of the row clock decoder circuit 4000 is shown in FIG. 4. In the preferred embodiment four such circuits are used in each sub-array. The one out of four decoding of row address signals RA0 and RA1 is achieved in a similar manner to the decoding of the other row address signals by the row address decoder described above. The undecoded row clock CR is a high drive capability clock which goes to a "high" logic level shortly after the row address buffers have been strobed and valid row address signals have been applied to the row decoders.

Figure 5:
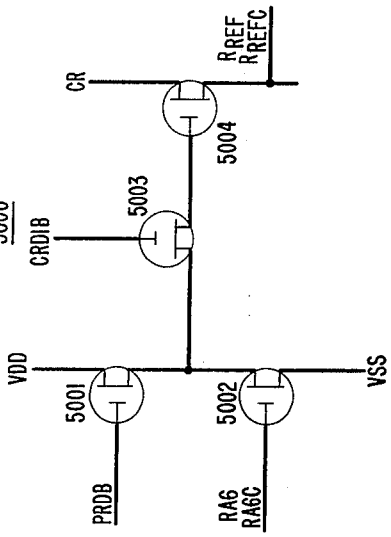
FIG. 5 is a schematic diagram of a reference row decoder/driver circuit.

The schematic diagram of the circuit for selecting a reference cell row is shown in FIG. 5. The row address signal RA6 is decoded to select a reference cell row in one of two blocks in a sub-array. Operation of this circuit is similar to that of the row address decoder discussed above.

Figure 6:
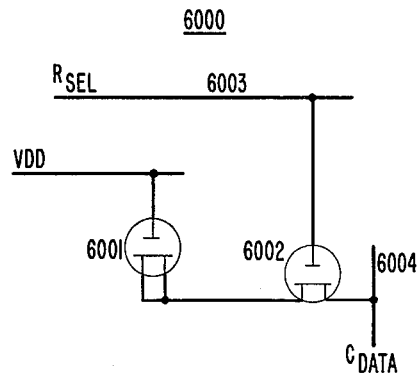
FIG. 6 is a schematic diagram of a one transistor, one capacitor memory cell.

The memory cell used in the array is a one transistor, one capacitor cell of the type which is found in most high density dynamic RAMs. Specific details of the memory cell form the subject matter of copending patent application, Ser. No. 942,861, filed on Sept. 15, 1978, and having a common assignee with the instant application. A schematic diagram of the cell is shown in FIG. 6. The storage capacitor 6001 has one plate connected to VDD and the other plate connected to the drain of the access transistor 6002. The source of the access transistor is connected to half-column conductor 6004 while the gate of the access transistor is connected to row conductor 6003. When a "high" logic level potential is applied to the row conductor, the access transistor becomes conducting causing the charge on the capacitor to be shared with that on the capacitance of the half-column conductor.

Figure 7:
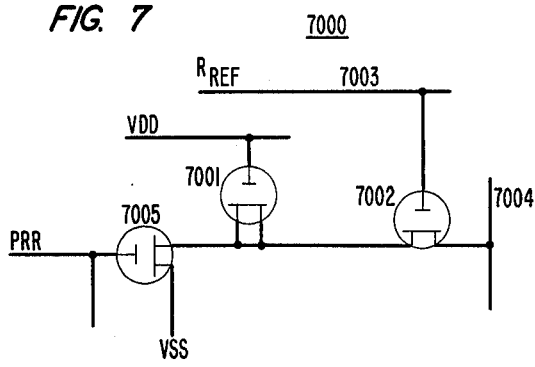
FIG. 7 is a schematic diagram of a reference cell.

A schematic diagram of the reference cell is shown in FIG. 7. The reference cell is similar to the memory cell except that the magnitude of its storage capacitance 7001 is approximately half that of the memory cell. In addition the reference cell includes a precharge transistor 7005 controlled by a precharge clock PRR for maintaining the reference cell capacitance at VSS while the sub-array is in the standby state.

Figure 8:
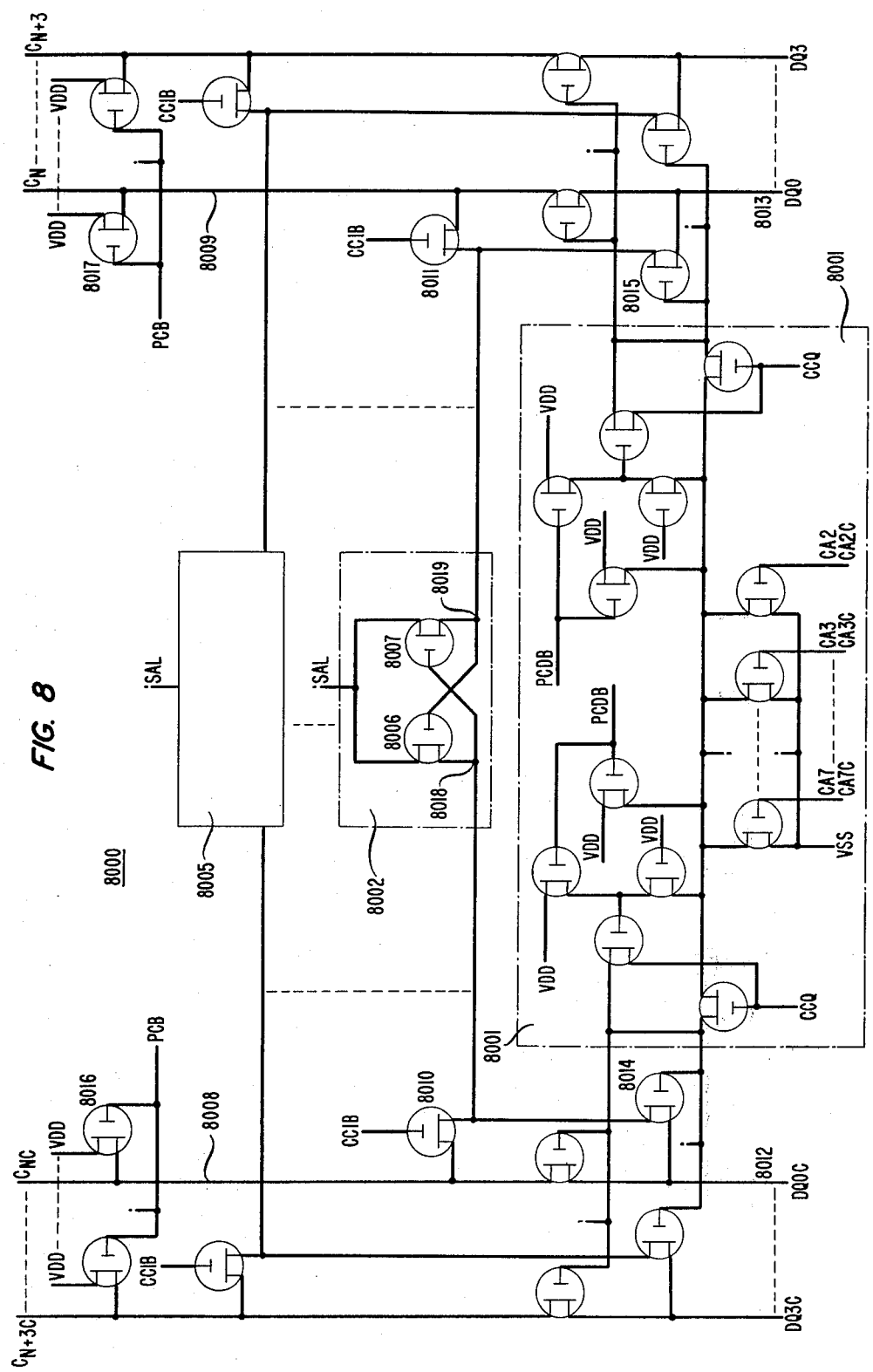
FIG. 8 is a schematic diagram of a column decoder and sense amplifier circuits.

Referring now to FIG. 8, there is shown a schematic diagram of a column decoder 8001 and four sense amplifiers 8002 through 8005. Each column decoder is associated with four half-column conductor pairs and to four sense amplifiers. Decoding of the column address signals CA2 through CA7 selects one out of 64 column decoders in the fully selected sub-array. The selected column decoder remains ready to transfer, upon the application of the data transfer clock CCQ, information on four half-column conductor pairs $C_N$, $C_NC$ through $C_{N+3}$, $C_{N+3}C$ to four I/O line pairs DQO, DQOC through DQ3,DQ3C. For simplicity, FIG. 8 shows only two of the four half-column conductor pairs, sense amplifiers and I/O line pairs.

As mentioned above in connection with the operation of the column address gates, the column address signals CA2 through CA7 are blocked from the column decoders of the partially selected sub-array. In addition, the data transfer clock CCQ is also blocked in the partially selected sub-array. A typical sense amplifier 8002 includes a pair of cross-coupled transistors 8006 and 8007 which are latched by the application of a latching signal SAL. The sense amplifier is coupled to a pair of half-column conductors 8008 and 8009 through a pair of interrupt transistors 8010 and 8011. Although these devices act as relatively high impedances, they introduce little delay in coupling the signal from the high capacitance half-column conductors to the low capacitance sense amplifier nodes 8018 and 8019. However, during latching, the high impedances of these devices provide two important benefits. First, the capacitance of the half-column conductors is decoupled from the sense amplifier thereby allowing the "low-going" sense amplifier node to discharge quickly. Upon application of the data transfer clock CCQ the rapidly developing signals on the sense amplifier nodes are coupled directly to the I/O line pairs through transistors 8014 and 8015. Second, the rate of discharge of the "low-going" half-column conductor is limited to reduce the magnitude of current transients. Thus, data is available on the I/O line pairs even before the cells of the selected row have completed their refresh operation, and fast access time is combined with low peak currents. Transistors 8016 and 8017 are used to precharge the half-column conductors 8008 and 8009 to VDD while the sub-array is in its standby state. Precharging is under the control of column precharge clock PCB which releases the half-column conductors from their precharge potential prior to row selection and recovers the half-column conductors to VDD when the sub-array returns to its standby state.

Specific features of the above-described sense amplifier configuration are claimed in copending application Ser. No. 010,740 filed concurrently with the instant application.

Figure 9:
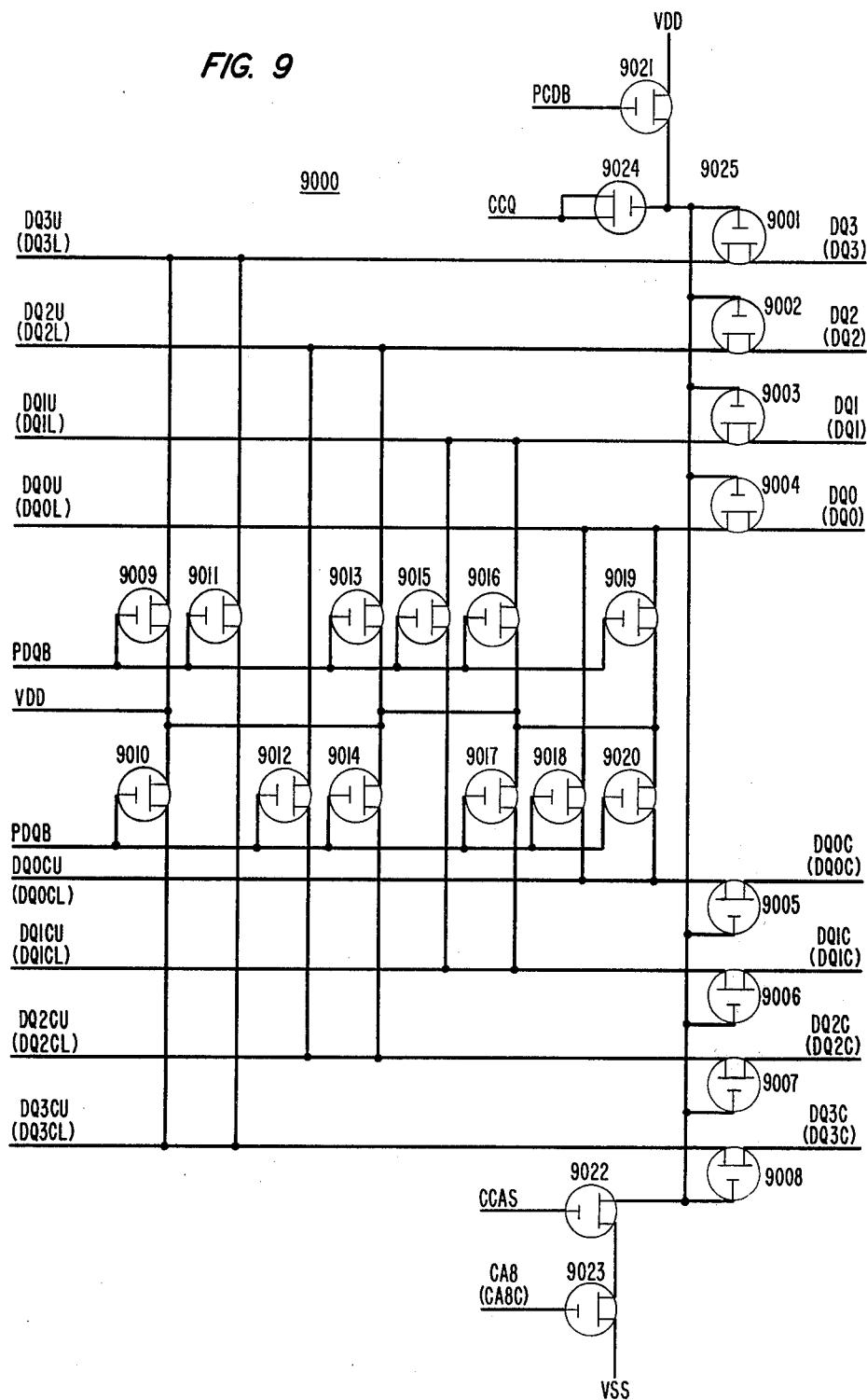
FIG. 9 is a schematic diagram of an input/output splitter circuit.

Referring now to FIG. 9, there is shown a schematic diagram of the I/O splitter circuit. The preferred embodiment includes two such circuits, one associated with each sub-array. The I/O splitter circuits couple the four I/O line pairs from the fully selected sub-array to the four I/O amplifiers and block the four I/O line pairs from the partially selected sub-array. The I/O line pairs from the upper sub-array are designated as DQOU, DQOCU through DQ3U, DQ3UC, while the I/O line pairs from the lower sub-array are designated by DQ0L, DQ0CL through DQ3L, DQ3CL. Transmission transistors 9001 through 9008 are interposed between the I/O line pairs and the double-rail inputs to the four I/O amplifiers. Precharge transistors 9009 through 9020 maintain the I/O line pairs at VDD while the circuit is in its standby state but release the I/O line pairs shortly before the data transfer clock CCQ is applied. Precharge transistor 9021 maintains the gates of the transmission transistors, node 9025, at VDD while the circuit is in its standby state. Transistor 9022 is controlled by the column address buffer strobe clock CCAS, and transistor 9023 is controlled by CA8 in the case of the upper I/O splitter and by CA8C in the case of the lower I/O splitter. Suppose for example CA8 were a "low" logic level corresponding to the upper sub-array being fully selected. Then in the upper I/O selector node 9025 would remain at VDD after CCAS goes "high". In addition the capacitor 9024 would be charged such that when the data transfer clock CCQ goes "high" the potential at the gates of the transmission transistors are boosted to greater than VDD+VT allowing the signals on the four I/O line pairs to be coupled to the four I/O amplifiers. In the lower I/O selector transistor 9023 would be in its conducting state by virtue of CA8C being a "high" logic level. The node 9025 would go to VSS when CCAS goes "high" and the capacitor 9024 would be discharged. Thus when CCQ goes "high" the gates of the transmission transistors would remain at VSS and the four I/O line pairs would be decoupled from the four I/O amplifiers.

Figure 10:
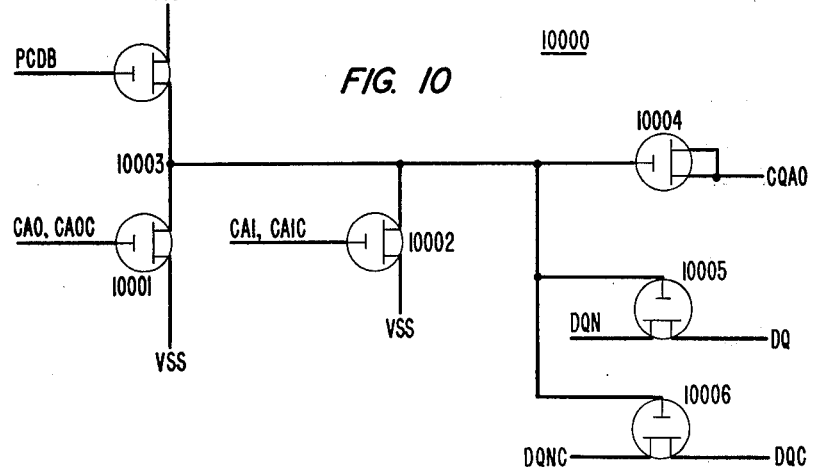
FIG. 10 is a schematic diagram of an input/output selector circuit. Each of the circuits shown in FIGS. 2 through 10 are typical of the circuits which may be used in the RAM shown in FIG. 1.

The schematic diagram for the I/O selector circuit 10000 is shown in FIG. 10. Four such circuits are used in the preferred embodiment to select one of the four I/O line pairs from the fully selected sub-array to be coupled to the I/O bus DQ,DQC. Transistors 10001 and 10002 decode the column address signals CA0 and CA1 to perform a one out of four selection of the I/O selectors. In the selected I/O selector the decode node 10003 remains at VDD charging the capacitor 10004. When the I/O amplifier strobe clock CQAO goes "high", the potential on the gates of transmission transistors 10005 and 10006 which are interposed between the selected I/O line pair and the I/O bus is boosted to above VDD+VT to permit efficient transfer of data to or from the I/O bus.

I claim:

1. A semiconductor memory device comprising a multiplicity of memory cells arranged in an ordered array of rows and columns, each row having an associated row conductor coupled to all cells in the row, each column having an associated column conductor coupled to all cells in the column, the array being divided into a plurality of sub-arrays; each sub-array having associated row decoder means and column decoder means; means for receiving an address; means for applying during an operating cycle a first part of the address to the row decoder means associated with each sub-array for selecting a corresponding row in each sub-array; a plurality of sense/refresh amplifier means, a different one coupled to each column conductor in each sub-array for sensing and for refreshing the contents of each cell situated along a selected row in each sub-array;

characterized in that there are included means responsive to a second part of the address for selecting during the operating cycle a sub-array for cell selection therein and for activating only the column decoder means associated with the selected sub-array.

2. A semiconductor memory device as recited in claim 1 further characterized in that the means for selecting a sub-array comprise means for applying, during the operating cycle, a third part of the address to only the column decoder means associated with the selected sub-array.

3. A semiconductor memory device as recited in claim 2 including input/output means for receiving data to be written into an accessed cell and/or for making available data read out of an accessed cell, means responsive to the part of the address for coupling the selected column in the selected sub-array to the input/output means.

4. A semiconductor memory device as recited in claim 3 wherein each sub-array is further divided into two related blocks, each column conductor in the sub-array being bisected into two related half-column conductors, each sense/refresh amplifier means being a cross-coupled differential amplifier and being situated between two related blocks, each amplifier having first and second inputs each coupled to a different one of related half-column conductors, the column decoder means being situated between two related blocks, each block having a row of reference cells, the row decoder means for selecting a row of memory cells in one block and for selecting the row of reference cells in the other related block.

5. A 64K dynamic RAM comprising memory cells arranged in an ordered array of rows and columns, the array being divided into two sub-arrays, each having 128 rows and 256 columns, means for refreshing simultaneously corresponding rows in each sub-array whereby all cells in the array are refreshed in 128 refresh cycles, means for selecting at a given time for reading and/or writing a single cell of a row in only one sub-array but for refreshing all cells in a corresponding row of the other sub-array.

* * * * *